(12) United States Patent
Rieger

(10) Patent No.: US 7,020,759 B2
(45) Date of Patent: Mar. 28, 2006

(54) DEVICE AND METHOD FOR ASSOCIATING INFORMATION CONCERNING MEMORY CELLS OF A MEMORY WITH AN EXTERNAL MEMORY

(75) Inventor: Martin Rieger, München (DE)

(73) Assignee: Infineon Technologies AG, Munich (DE)

( * ) Notice: Subject to any disclaimer, the term of this patent is extended or adjusted under 35 U.S.C. 154(b) by 245 days.

(21) Appl. No.: 10/298,970

(22) Filed: Nov. 18, 2002

(65) Prior Publication Data

US 2003/0120891 A1    Jun. 26, 2003

(30) Foreign Application Priority Data

Nov. 16, 2001   (DE) ................................. 101 56 358

(51) Int. Cl.
*G06F 12/00*     (2006.01)

(52) U.S. Cl. ..................... 711/202; 710/68; 710/127; 710/65; 711/171; 711/172; 711/105

(58) Field of Classification Search ................ 711/165, 711/171, 172, 202, 105; 710/68, 127, 65
See application file for complete search history.

(56) References Cited

U.S. PATENT DOCUMENTS 5,768,546 A  *  6/1998  Kwon ........................ 710/307
6,237,069 B1     5/2001  Fan ............................. 711/165

\* cited by examiner

*Primary Examiner*—Mano Padmanabhan
*Assistant Examiner*—Mehdi Namazi
(74) *Attorney, Agent, or Firm*—Laurence A. Greenberg; Werner H. Stomer; Ralph E. Locher

(57) ABSTRACT

In a device and a method associating information concerning first memory cells and second memory cells of a memory element with an external memory, with each address of the memory element having a first predetermined number of memory cells associated therewith and each address of the external memory having a second number of memory cells associated therewith that is greater than said first predetermined number, and with said second predetermined number of memory cells on each address of the external memory being adapted to be subdivided into a first group of memory cells and a second group of memory cells, an input receives the information concerning said first and second memory cells. The information concerning first memory cells is assigned to the first group of memory cells in the external memory, and the information concerning the second memory cells is associated to the second group of memory cells in the external memory. Via an output adapted to be connected to the external memory, the information concerning the memory cells of the memory element is output to the associated group in the external memory.

11 Claims, 3 Drawing Sheets

DEVICE AND METHOD FOR ASSOCIATING INFORMATION CONCERNING MEMORY CELLS OF A MEMORY WITH AN EXTERNAL MEMORY

BACKGROUND OF THE INVENTION

1. Field of the Invention

The present invention relates to a device and a method for associating information concerning memory cells in a memory element with an external memory, and in particular to a device and a method for associating fault information in testing the memory element with the external memory and for filing the information in the same.

2. Description of the Related Art

Dynamic semiconductor memories, such as e.g. DRAMs (DRAM=Dynamic Random Access Memory), as a rule have additional, redundant memory cells apart from a number of memory cells in a regular portion which corresponds to the nominal size of the semiconductor memory. Upon manufacture of a semiconductor memory, all memory cells are tested with respect to operability thereof and defective memory cells in the regular portion are replaced by operable redundant memory cells by re-addressing. The replacement of the memory cells as a rule does not take place individually, but by re-addressing of complete rows or columns of a cell matrix. The information concerning the operability of the memory cells is filed or stored in a fault memory.

All DRAMs usual in the market have nominal sizes corresponding to a power of 2. Changing of the address space with equal memory size by changing the number of inputs/outputs or data channels (DQs) in the same relationship is usual in the art. For example, a reduction of the number of address bits by 1 can be obtained by doubling the number of data channels (DQs) . However, if the bit size of a cell field cannot be expressed by a power of 2, operation takes place in an effective address space corresponding to the next higher power of 2. This is as a rule the case, for example, when a memory element is considered inclusive of its redundant elements. Due to the fact that the number of redundant memory cells as a rule is just a few percent of the number of regular memory cells (e.g. approx. 4% in a 32 MB chip), a large part of the effective address space is thus left unused. This is disadvantageous if the aforementioned testing of the operability of all memory cells of a memory element is carried out with test systems as they are usual in the market, making use of a fault memory of a size corresponding to the effective address space. Consequently, there is arising an unnecessarily high fault memory demand.

In the following, a memory element having four regular memory cells and two redundant memory cells is to be assumed as an example, with each of these cells being addressed via an address. Thus, there are in total six addresses necessary. A fault memory employed in the prior art, thus, would have a size with eight memory cells, since eight is the next higher power of two in relation to six. In this case, there are thus two addresses and the associated memory cells in the fault memory not made use of. The number of unused addresses increases dramatically when this simple example is transferred to larger memory elements.

SUMMARY OF THE INVENTION

It is the object of the present invention to provide an improved device and an improved method for associating information with a memory, permitting a required memory size of the memory for filing the information to be reduced.

The present invention is a device for associating information concerning first memory cells and second memory cells of a memory element with an external memory, each address of the memory element having a first predetermined number of memory cells associated therewith, each address of the external memory having a second number of memory cells associated therewith that is greater than the first predetermined number. The second predetermined number of memory cells on each address of the external memory is adapted to be subdivided into a first group of memory cells and a second group of memory cells. The device comprises an input for receiving the information concerning the first and second memory cells. The device comprises a means for associating the information concerning first memory cells with the first group of memory cells in the external memory and for associating the information concerning the second memory cells with the second group of memory cells in the external memory. The device comprises an output adapted to be connected to the external memory for outputting the information concerning the memory cells of the memory element to the associated group in the external memory.

The present invention is a device for associating information concerning first memory cells and second memory cells of a memory element with an external memory in which, for reading out information concerning the first memory cells or the second memory cells at an address in the memory element, the memory element has a first number of data channels associated therewith and in which, for reading in information at an address of the external memory, the external memory has a second number of data channels associated therewith that is greater than the first number, the data channels of the external memory being adapted to be subdivided into a first group and a second group. The device comprises an input adapted to be connected to the data channels of the memory element, for receiving information concerning the first memory cells and the second memory cells. The device comprises an output adapted to be connected to the data channels of the external memory. The device comprises a means for associating the information concerning the first memory cells of the memory element with the first group of data channels of the external memory and for associating the information concerning the second memory cells of the memory element with the second group of data channels.

The present invention is a method for associating information concerning first memory cells and second memory cells of a memory element with an external memory, each address of the memory element having a first predetermined number of memory cells associated therewith, each address of the external memory having a second predetermined number of memory cells associated therewith that is greater than the first predetermined number, the second predetermined number of memory cells on each address of the external memory being adapted to be subdivided into a first group of memory cells and a second group of memory cells. The method comprises receiving the information concerning first and second memory cells. The method comprises assigning the information concerning the first memory cells to the first group of memory cells in the external memory. The method comprises assigning the information concerning the second memory cells to the second group of memory cells in the external memory. The method comprises outputting the information concerning the memory cells of the memory element to the associated group in the external memory.

According to one aspect, the present invention provides a memory component including a memory element having first memory cells and second memory cells, which comprises a device according to the present invention.

According to another aspect, the present invention provides a memory testing device which comprises a device according to the present invention.

A first address space that is defined by the number of addresses of the memory element where first memory cells are arranged, and an external address space that is defined by the number of addresses of the external memory where memory cells of the external memory are arranged, may be equal.

The present invention makes use of the fact that memory testing systems usual in the market as a rule have 9, 18 or 36 data channels in order to test also memories with parity bit. However, in reality a large number of the DRAMs manufactured does not have such a parity bit. The fault memory which, in numerous test systems, is fixedly associated with the channels of the parity bits, according to the invention, is made usable for the redundant portion of memory elements (without parity bit), i.e. for filing fault information concerning the redundant portion of the memory element (without parity bit). By intermediate buffering, in particular intermediate buffering of the fault information concerning the redundant portion of the memory element, this distribution of the data to additional outputs or the data channels provided for parity bits can be effected without increase in testing time. The advantage of ultimate feeding to the regular testing device memory consists in that additional subsequent analysis devices may then be utilized, in particular a redundancy analyzer.

It is rendered possible by the invention to densely utilize the address space, in particular the address space of the fault memory, and, instead of increasing the address space to the next power of two, to leave the address space unchanged, in particular to select the address space in accordance with the nominal size of the memory element, and to increase the number of data outputs by a factor of smaller than 2.

An advantage of the present invention thus consists in a reduction of the effective demand of fault memory in testing a memory element and in particular in checking redundant cells. Thus, in testing a memory element, the invention, for example, successfully achieves, by way of a circuit, a reduction of size of the address space by increasing the number of data outputs, without interfering with the normal function of the DRAM, with the increase in the number of data outputs not taking place in the same ratio as the reduction of address space. The device or circuit according to the invention can be realized externally, e.g. by an ASIC (Application Specific Integrated Circuit) that is mounted on a probe card or is a constituent part of a memory testing system. In that case, there are no changes whatsoever necessary to the DRAM. As an alternative, such a circuit may be integrated in the DRAM, and use thereof may be controlled via a test mode. In this case too, there is no change to the cell field architecture necessary.

A device or circuit according to the present invention has n inputs and m>n, m<2n outputs and may be operated in a buffer mode and in an output mode. In the buffer mode, the n input data are filed in an addressable intermediate memory or buffer means. The memory cells are selected in accordance with address bits applied. In the output mode, the n inputs are connected through to the first n outputs. The contents of the buffer memory is output in parallel via the remaining m−n outputs, with the respective datum being selected in accordance with addresses applied. The assignment between address bits applied and cells of the buffer memory is programmable and may differ in the buffer mode and in the output mode.

Further developments of the present invention are defined in the dependent claims.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
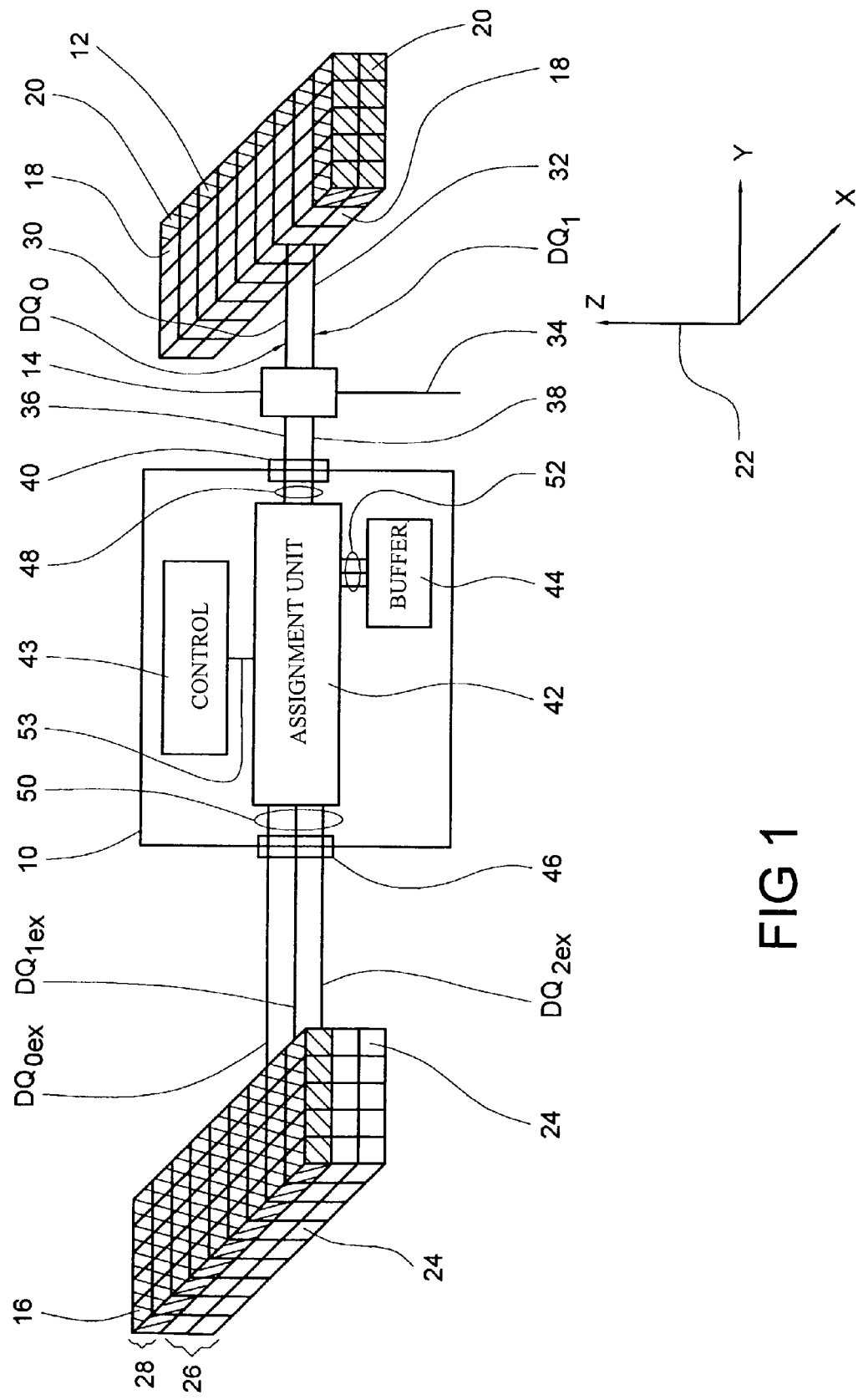
FIG. 1 is a schematic representation of an embodiment of the present invention.

FIG. 1 illustrates a schematic representation of a preferred embodiment of the present invention. The device 10 according to the invention is illustrated together with a memory element 12, a comparator 14 and a fault memory 16.

The memory element 12 comprises first memory cells 18 (shown in white color in FIG. 1) and second memory cells 20 (shown in hatched manner in FIG. 1). For keeping a clear illustration, only some of the memory cells in FIG. 1 bear reference numerals.

The first memory cells 18 are arranged in a regular portion of the memory element 12, preferably in matrix form, in four columns and eight rows. In order to more clearly illustrate the directions, FIG. 1 schematically shows a coordinate system 22. The columns are arranged adjacent each other in y direction and extend in x direction. The rows are arranged adjacent each other in x direction and extend in y direction. The arrangement just described relates to addressing by means of a column address (having a length of 2 bits) and a row address (having a length of 3 bits), and not necessarily to the spatial arrangement of the first memory cells 18 in the memory element 12. Each address in the memory element 12, i.e. each combination of a column address and a row address, has two memory cells associated therewith, and each memory cell is adapted to store one bit each. The memory cells at one address are arranged along the z direction.

The second memory cells 20 are arranged in an additional row and an additional column that are adjacent the matrix of the first memory cells 18. Here, too, the columns are adjacent each other in y direction and extend in x direction, and the rows are adjacent each other in x direction and extend in y direction. Each address has two memory cells arranged thereon in z direction.

FIG. 1 shows furthermore two data lines $DQ_0$ and $DQ_1$ associated with the memory element 12. Via the data lines $DQ_0$ and $DQ_1$, data/information is/are read into the memory element and read out from the same, respectively. The number of data lines is dependent upon the bit depth of the memory. In the embodiment illustrated in FIG. 1, each address has two memory cells associated therewith so that the data/information is/are read in and out, respectively, via the two data lines $DQ_0$ and $DQ_1$. In reading out the data/information, the data are delivered to the data lines from the memory cells associated with the addresses, and in reading in the data/information, the data are transferred from the data lines to the memory cells associated with the addresses.

The fault memory 16 comprises a plurality of memory cells 24; for reasons of better visibility, the representation of FIG. 1 again shows only some referenced memory cells of the external memory 16. The memory cells 24 are also arranged in the form of a matrix having four columns and eight rows.

The columns are adjacent each other in y direction and extend in x direction. The rows are adjacent each other in x direction and extend in y direction. Differently from the memory element 12, each address of the external memory 16, i.e. each combination of a column address and a row address, has three memory cells associated therewith, extending at each address along the z direction.

The memory cells 24 at an address of the external memory can be subdivided into a first group 26 of memory cells (shown in white color in FIG. 1) and into a second group 28 of memory cells (shown in dotted form in FIG. 1), and in the embodiment shown in FIG. 1, the first group 26 has two memory cells associated therewith and the second group 28 has one memory cell associated therewith.

FIG. 1 illustrates, furthermore, three data lines $DQ_{0ex}$, $DQ_{1ex}$ and $DQ_{2ex}$ associated with external memory 16. Via these data lines $DQ_{0ex}$, $DQ_{1ex}$ and $DQ_{2ex}$, data/information is/are read into the external memory and read out from the same, respectively. The number of data lines is dependent upon the bit depth of the external memory. In the embodiment illustrated in FIG. 1, each address has three memory cells associated therewith, so that the data/information is/are read in and out, respectively, via the three data lines $DQ_{0ex}$, $DQ_{1ex}$ and $DQ_{2ex}$. In reading out the data/information, the data are delivered to the data lines from the memory cells associated with the addresses, and in reading in the data/information, the data are transferred from the data lines to the memory cells associated with the addresses.

Due to the splitting of the memory cells at an address in the external memory into the two groups 26, 28, the data lines are correspondingly associated as well. It is to be assumed for the embodiment shown in FIG. 1 that the lines $DQ_{0ex}$ and $DQ_{1ex}$ are associated with the memory cells of the first group 26 and that the data line $DQ_{2ex}$ is associated with the memory cell of the second group 28.

The comparator 14 is connected between the memory element 12 and the device 10 according to the invention. The comparator 14 receives data from the memory cells of the memory element associated with the data lines, via a first section 30 of data line $DQ_0$ and via a first section 32 of data line $DQ_1$. At a reference input 34, comparator 14 receives a comparison signal. The signals (data/information) received by the data lines $DQ_0$ and $DQ_1$ are compared to the comparison signal. Depending on the result of the comparison, output signals are generated indicative of this result. The comparator 14 outputs the output signals concerning the signals received on data line $DQ_0$ to a second section 36 of data line $DQ_0$, and the output signals concerning the signals received on data line $DQ_1$ via a second section 38 of data line $DQ_1$.

For ascertaining the operability of the first and second memory cells 18, 20 of the memory element 12, a signal is applied to comparator 14 at the reference input 34 thereof that corresponds to a signal on one of the data lines $DQ_0$ or $DQ_1$ when the memory cells from which this signal originates operate properly, i.e. when the value read from the memory cells is identical with the value read into the memory cells therebefore (from which is derived the comparison signal for the comparator). The information concerning the operability of the first and second memory cells 18, 20 of the memory element 12 are, e.g. "1" when the memory cells do not function properly, or "0" in case these are operative.

The device 10 according to the invention comprises an input 40 adapted to be connected to the first section 36 of data line $DQ_0$ and to the second section 38 of data line $DQ_1$ in order to receive the output signals output from the comparator 14. Furthermore, there is provided a unit 42 for assigning, or association information concerning the first memory cells 18 and the second memory cells 20 with the afore-mentioned groups in the external memory 16. A control means 43 is provided for controlling the operation of the device 10 according to the invention as will still be elucidated in more detail hereinafter. The device furthermore contains a buffer 44 the operation of which will also be explained in more detail hereinafter. An output 46 is adapted to be connected to the three data lines $DQ_{0ex}$, $DQ_{1ex}$ and $DQ_{2ex}$ for outputting data/information received from the memory element to the corresponding groups of memory cells in the external memory 16, in accordance with the operation of the assignment unit 42 as described in the following.

The assignment unit 42 is connected to input 40 via data lines 48, to output 46 via data lines 50, and to buffer 44 via data lines 52. The control means 43 is connected to the assignment unit 42 via control lines 53.

In the following, the operation of the device 10 according to a preferred embodiment will be explained in more detail. The control means 43 effects operation of the device 10 in a first mode, the buffer mode, and in a second mode, the output mode.

In the buffer mode, information received by the device 10 via input 40 is transferred to the buffer 44 and stored there. In this mode, there is no information applied to the output 46, and information thus is not passed on to the external memory 16 either.

In the output mode, information received by the device 10 via input 40 and information filed in buffer 44 is applied to the output 46. The assignment unit 42 in this regard is operative for associated the information received from input 40 with the first group 26 of memory cells in the fault memory 16, by outputting the information in the present embodiment on the data lines $DQ_{0ex}$ and $DQ_{1ex}$ associated with the first group. The assignment unit 42, furthermore, is operative for assigning the information stored in buffer 44 to the second group 28 of memory cells in the fault memory 16, by outputting the information in the present embodiment on the data line $DQ_{2ex}$ associated with the second group.

By means of the device according to the invention, the information concerning the first memory cells thus is filed in the external memory in the first group of memory cells, and the information concerning the second memory cells is filed in the external memory in the second group of memory cells.

By way of FIG. 2 and FIG. 3, an additional embodiment of the present invention will be described hereinafter, in which the device detects fault information for a known DRAM and files the same in an external fault memory. The DRAM to be tested has eight data channels and a nominal size of 64 MB. The DRAM is divided into four banks with 4096 row addresses and 512 column addresses each. The main cell field or regular portion is addressed via 12 y address bits, 9 x address bits and two bank bits. In addition thereto, each bank contains 16 addresses for redundant rows and 16 addresses for redundant columns, i.e. there are 2312 kB redundancy, which is 3.53% of the nominal size of the DRAM.

Figure 2:
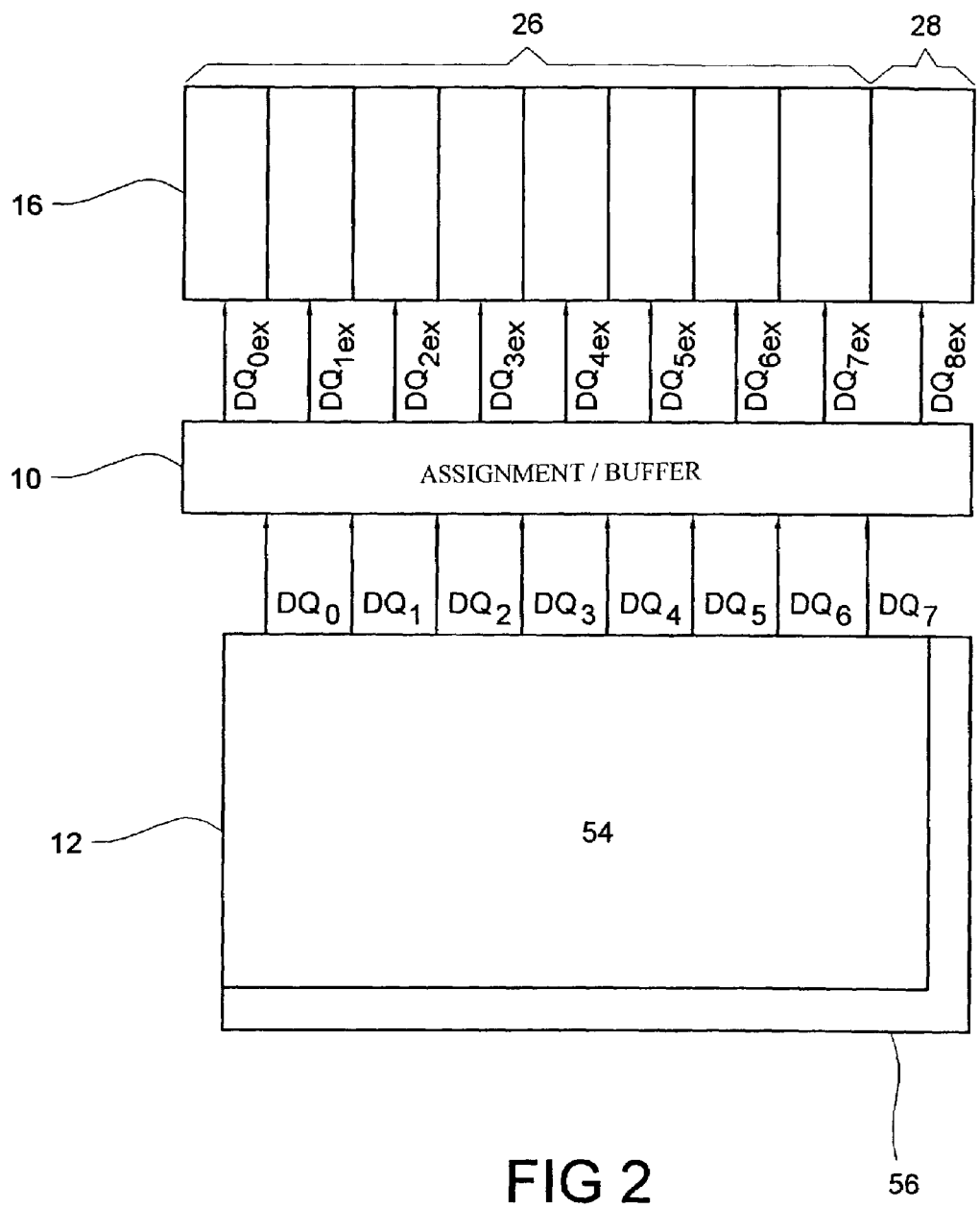
FIG. 2 is a schematic representation of an additional embodiment of the present invention.

FIG. 2 shows a schematic representation of the device 10 according to the invention, a bank 12 (memory element) of the DRAM, and of the fault memory 16. The memory element 12 comprises a main cell field 54 (regular memory cells) and a redundant cell field 56 which, in the embodiment illustrated, comprises 16 redundant columns and 16 redundant rows. The memory element 12 is connected to the device 10 via eight data channels $DQ_0$ to $DQ_7$. The fault memory 16 is connected to the device 10 via nine data channels $DQ_{0ex}$ to $DQ_{8ex}$. The comparator is not shown in FIG. 2.

For the redundant rows and columns of the memory element 12, the table shown hereinafter illustrates the addressing scheme. In addition to the 12 row bits A0 to A11, which would be sufficient for addressing the 4096 rows, there is an additional address bit AX having a value of 0 when regular rows are addressed, and having a value of 1 when redundant rows are addressed. The table contains, in the form of rows, the related state of all address bits A0 to AX for each of the 16 redundant rows RL0 to RL15.

tion applying between the cells of the redundant portion 56 of the buffer element 12 and the memory cells of the buffer. The buffer in this case needs to have a size of 578 kB.

After testing of the redundant portion 56 of the memory element 12, the main cell field 56 of the memory element 12 is tested. In this regard, AX=0 holds both for the column address and for the row address, which means furthermore that the device 10 operates in the output mode. In the output mode the eight data channels $DQ_0$ to $DQ_7$ are connected via the device 10 directly to the first eight data channels $DQ_{0ex}$ to $DQ_{7ex}$ associated with the first group 26 of memory cells of the fault memory 16. The ninth data channel $DQ_{8ex}$, associated with the second group 28 of memory cells of the fault memory 16, is connected to the buffer. Along with each transmission of results of a test of eight memory cells associated with an address of the regular portion 54 of the memory element 12, to the eight data channels $DQ_{0ex}$ to $DQ_{7ex}$, results of a test concerning memory cells of the redundant portion 56 of the memory element 12, which results are stored in the buffer, are transmitted in bitwise fashion via the ninth data channel $DQ_{8ex}$.

Which memory cell of the buffer is read upon application of a specific address of the regular portion 54 and, thus, also

|      | A0 | A1 | A2 | A3 | A4 | A5 | A6 | A7 | A8 | A9 | A10 | A11 | AX |
|------|----|----|----|----|----|----|----|----|----|----|-----|-----|----|
| RL0  | 0  | 0  | 0  | 0  | 0  | 0  | 0  | 0  | 0  | 0  | 0   | 0   | 1  |
| RL1  | 1  | 0  | 0  | 0  | 0  | 0  | 0  | 0  | 0  | 0  | 0   | 0   | 1  |
| RL2  | 0  | 1  | 0  | 0  | 0  | 0  | 0  | 0  | 0  | 0  | 0   | 0   | 1  |
| RL3  | 1  | 1  | 0  | 0  | 0  | 0  | 0  | 0  | 0  | 0  | 0   | 0   | 1  |
| RL4  | 0  | 0  | 1  | 0  | 0  | 0  | 0  | 0  | 0  | 0  | 0   | 0   | 1  |
| RL5  | 1  | 0  | 1  | 0  | 0  | 0  | 0  | 0  | 0  | 0  | 0   | 0   | 1  |
| RL6  | 0  | 1  | 1  | 0  | 0  | 0  | 0  | 0  | 0  | 0  | 0   | 0   | 1  |
| RL7  | 1  | 1  | 1  | 0  | 0  | 0  | 0  | 0  | 0  | 0  | 0   | 0   | 1  |
| RL8  | 0  | 0  | 0  | 1  | 0  | 0  | 0  | 0  | 0  | 0  | 0   | 0   | 1  |
| RL9  | 1  | 0  | 0  | 1  | 0  | 0  | 0  | 0  | 0  | 0  | 0   | 0   | 1  |
| RL10 | 0  | 1  | 0  | 1  | 0  | 0  | 0  | 0  | 0  | 0  | 0   | 0   | 1  |
| RL11 | 1  | 1  | 0  | 1  | 0  | 0  | 0  | 0  | 0  | 0  | 0   | 0   | 1  |
| RL12 | 0  | 0  | 1  | 1  | 0  | 0  | 0  | 0  | 0  | 0  | 0   | 0   | 1  |
| RL13 | 1  | 0  | 1  | 1  | 0  | 0  | 0  | 0  | 0  | 0  | 0   | 0   | 1  |
| RL14 | 0  | 1  | 1  | 1  | 0  | 0  | 0  | 0  | 0  | 0  | 0   | 0   | 1  |
| RL15 | 1  | 1  | 1  | 1  | 0  | 0  | 0  | 0  | 0  | 0  | 0   | 0   | 1  |

The addressing scheme for the redundant columns has a corresponding structure, with address bits A9 to A11 being omitted as the regular 512 regular columns are addressed by 9 address bits A0 to A8.

The additional address bit AX, on the one hand, permits accessing of redundant rows and columns, respectively, and on the other hand, controls the mode of operation of the device 10 according to the invention. The control means of the circuit receives the additional address bit AX and controls the mode of operation of the circuit in accordance with the value thereof. If AX equals 1, the circuit is in the buffer mode, and if AX is 0, the circuit is in the output mode.

It is to be assumed that the comparator outputs for each operative memory cell a "0" and for each non-operative memory cell a "1". The test of the DRAM takes place in banks, i.e. all test patterns or sequences are applied bank for bank in succession so as to keep the necessary intermediate memory (buffer) small. Within each bank 12, the test is started in the redundant portion 56.

As it holds in testing of memory cells in a redundant row and/or a redundant column that AX=1 at least either in the row address or in the column address, the circuit is in the buffer mode. The results for each individual cell are filed in the buffer of the device 10, with a fixed one-to-one allocawhich memory cell is concerned by the fault information that is filed at the specific address in the memory cell of the fault memory 16 associated with the ninth channel $DG_{8ex}$, is controlled or programmed such that the information from the buffer is filed in the fault memory 16 in a form in which it is easily readable for a subsequent redundancy analysis and can easily be assigned to the original addresses of the redundant portion 56 of the memory element 12.

Figure 3:
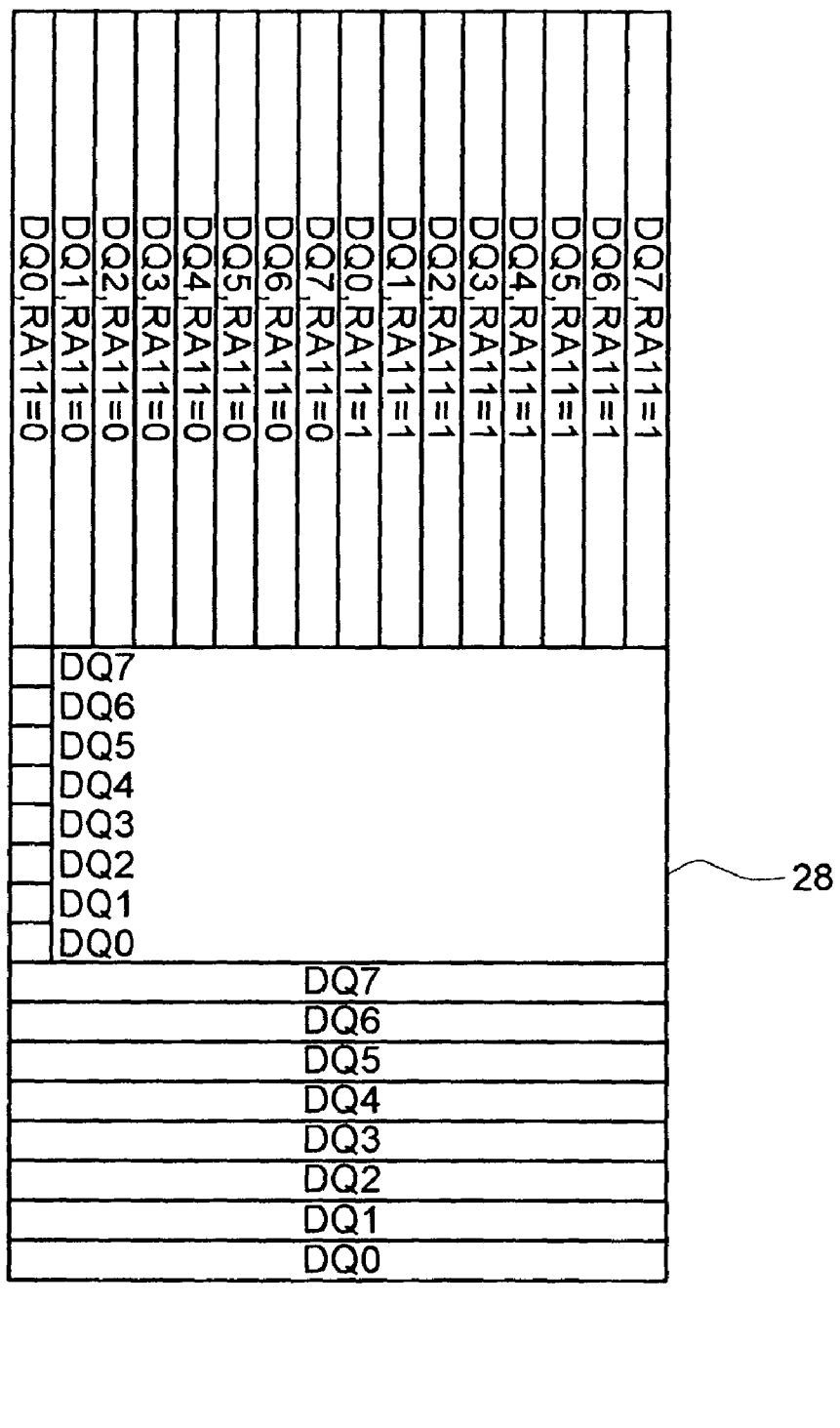
FIG. 3 is a schematic representation of a portion of a fault memory or part of the address space, illustrating an assignment of addresses of the fault memory to the second memory cells.

FIG. 3 illustrates an example of an assignment between memory cells in the redundant portion 56 of the memory element 12 and memory cells of the ninth data channel of the fault memory, in which the number of row and column addresses is 4096 and 512, respectively; the figure merely illustrates the memory cells of the fault memory associated to the ninth data channel $DQ_{8ex}$.

In FIG. 3, the rows are arranged horizontally and the columns vertically, with row 0 being arranged at the lower margin and row 4095 at the upper margin, and column 0 being arranged at the left-hand margin and column 511 at the right-hand margin. Each subdivision in horizontal direction comprises 128 row addresses, and each subdivision in vertical direction comprises 32 comprises 32 column addresses, in each of which is filed information concerning second memory cells 20 of the 16 redundant rows and the 16 redundant columns, respectively.

The assignment of information concerning the memory cells of the redundant portion of the memory element 12 to memory cells of the fault memory 16, as illustrated in FIG. 3, may be described by the following equations, in which XP and YP are the addresses under which the data are stored in the buffer (corresponding to the addresses of the DRAM if AX is entered as thirteenth bit or X12 for rows and as tenth bit or Y9 for columns), and X and Y are the addresses of the fault memory that are also received by the device 10 via an address input that is not shown. DP represents the original allocation of the data channels.

| | | | |
|---|---|---|---|
| If X 11 = 0: | XP = X & 0x7F \| 0x1000 | YP = Y \| X10<<9 | DP0 – 2 = X7 – 9 |
| If X11 = 1 and Y8 = 0: | XP = X | YP = Y & 0x1F | DP0 – 2 = Y5 – 7 |
| If X11 = 1 and Y8 = 1: | XP = X & 0x7FF | YP = Y & 0x1F | DP0 – 2 = Y5 – 7 |

The notation is to be understood such that "&" represents a bitwise logic AND operation, "|" , represents a bitwise logic OR operation, "<<" represents a shift by n bits to the left, and figures preceded by "0x" are to be interpreted as hexadecimal. Designations of row or column addresses (X, Y, XP, YP) without subsequent figures relate to all bits of the row or column address, while a subsequent figure selects an individual bit (e.g. X11), and figures with hyphen (DP0-2) refer to several correspondingly selected bits.

The arrangement of information concerning the memory cells from the redundant portion of memory element 12 in the memory cells of the ninth data channel of fault memory 16 thus takes place such that the utilization of a redundancy analysis device of the memory testing system, of which the fault memory is part, is rendered possible.

In the above-described buffer mode of the device 10 according to the invention, there is no information output to the fault memory 16.

The device 10, for example, may be part of a probe card utilized in testing semiconductor memory elements after manufacture thereof on a wafer and still before separation thereof for establishing electrical contact with the memory elements. The device 10 according to the invention, however, may also be part of a memory testing system or may be integrated on a semiconductor chip together with the memory element 12.

Due to the fact that fault information concerning a memory cell as a rule comprises only one bit (either operative or not operative), the total number of memory cells of the fault memory 16 at least must be as great as the overall number of memory cells of the memory element 12 to be tested, provided that each memory cell of the fault memory 16 is capable of storing one bit.

In the embodiments, the number of memory cells associated with each address was each time greater by one for the fault memory 16 than for the memory element 12. However, differently therefrom, it is also possible to have a greater difference, and conventional memory testing systems often have e.g. 9, 18 or 36 data channels, as they are provided for testing memory elements with 1, 2 or 4 bytes per memory address and one parity bit per byte. The number of memory cells on each address of the fault memory then is generally subdivided into a first group of memory cells and a second group of memory cells, with the number of memory cells in the first group of memory cells on each address of the fault memory being preferably equal to the number of memory cells on each address of the memory element to be tested. In this case, the memory cells of the memory element can be subdivided into first memory cells and second memory cells, with an address space of the first memory cells having exactly the same size as the address space of the fault memory, so that information concerning the first memory cells at an address of the memory element in the first group of memory cells can be filed on the same address in the fault memory, and information concerning the second memory cells of the memory element can be filed in the second group of memory cells of the fault memory in accordance with a scheme as illustrated in exemplary manner by way of FIG. 3.

The information concerning the first and second memory cells may comprise not only fault information, but e.g. also information stored in the first and second memory cells, with the fault memory being referred to as external memory in more general terms.

The device and the method according to the present invention may be used in general for transferring or assigning arbitrary information from a first address space, in which each address has a first number of memory cells associated therewith, to another, smaller address space in which each address has a second number of memory cells associated therewith, if the second number is greater than said first number.

The utilization of the buffer means 44 described by way of the embodiment of FIG. 1 has the advantage that each address of the memory element 12 and each address of the fault memory or external memory 16 need be addressed only once, so that the filing of information concerning memory cells of the memory element 12 in the external memory 16 can take place in the shortest possible period of time. As an alternative, it is possible to dispense with the buffer means 44 if the memory cells of the first group and the second group can each be written separately at an address in the external memory 16. In this case, the information concerning the first memory cells 18 and the second memory cells 20 of the memory element 12 can be read into the first group and the second group of memory cells on each address of the external memory 16 successively instead of simultaneously. However, as multiple access is made in this case to a plurality of addresses of the external memory 16, this may be accompanied by an increased requirement of time.

LIST OF REFERENCE NUMERALS

| | |
|---|---|
| 10 | device |
| 12 | memory element |
| 14 | comparator |
| 16 | external fault memory |
| 18 | first memory cells of memory element 12 |
| 20 | second memory cells of memory element 12 |
| 22 | coordinate system |
| 24 | memory cells of external fault memory 16 |
| 26 | first group of memory cells in external fault memory 16 |
| 28 | second group of memory cells in external fault memory 16 |
| 30 | first section of data line $DQ_0$ |
| 32 | first section of data line $DQ_1$ |
| 34 | reference signal input of comparator 14 |
| 36 | second section of data line $DQ_0$ |
| 38 | second section of data line $DQ_1$ |
| 40 | input of device 10 |
| 42 | assignment unit |

-continued

| | |
|---|---|
| 43 | control means |
| 44 | buffer |
| 46 | output of device 10 |
| 48 | data lines in device 10 |
| 50 | data lines in device 10 |
| 52 | data lines in device 10 |
| 53 | control lines in device 10 |
| 54 | main cell field |
| 56 | redundant cell field |
| $DQ_0$ - $DQ_7$ | data channels of memory element 12 |
| $DQ_{0ex}$ - $DQ_{8ex}$ | data channels of fault memory 16 |

What is claimed is:

1. A device for associating information concerning first memory cells and second memory cells of a memory element with an external memory, each address of the memory element having a first predetermined number of memory cells associated therewith, each address of the external memory having a second predetermined number of memory cells associated therewith that is greater than said first predetermined number, said second predetermined number of memory cells on each address of the external memory being adapted to be subdivided into a first group of memory cells and a second group of memory cells, said device comprising:
   an input for receiving the information concerning said first and second memory cells;
   a means for associating the information concerning first memory cells with the first group of memory cells in the external memory and for associating the information concerning the second memory cells with the second group of memory cells in the external memory; and
   an output adapted to be connected to the external memory for outputting the information concerning the memory cells of the memory element to the associated group in the external memory;
   wherein said means for associating the information associates the addresses of the memory cells of the memory element with addresses of the external memory; and
   wherein said means for associating the information is configured to simultaneously store, in said first group of memory cells at a target address in the external memory, information concerning first memory cells of the memory element and, in said second group of memory cells at the target address in the external memory, information concerning second memory cells at an address of the memory element associated with said target address.

2. The device of claim 1, wherein information concerning said first and second memory cells of the memory element comprises information on operability of each of said first and second memory cells.

3. The device of claim 1, wherein the first memory cells are contained in a regular portion of the memory element and the second memory cells are contained in a redundant portion of the memory element.

4. The device of claim 2, wherein the number of addresses of the memory element having the first memory cells associated therewith defines a first address space, and wherein the number of addresses of the external memory having the memory cells of the external memory associated therewith defines an external address space, said first address space and said second address space being equal.

5. The device of claim 1, comprising a buffer means for storing the information concerning the second memory cells.

6. The device of claim 5, comprising a control means which, in response to a control signal output, sets a first operating mode in which the butter means receives and stores information concerning the second memory cells of the memory element, or sets a second operating mode in which the device receives information concerning the first memory cells from the memory element and outputs the same to the first group of memory cells of the external memory and at the same time outputs information concerning second memory cells of the memory element, that is filed in said buffer means, to the second group of memory cells of the external memory.

7. A device for associating information concerning first memory cells and second memory cells of a memory element with an external memory in which, for reading out information concerning the first memory cells or the second memory cells at an address in the memory element, said memory element has a first number of data channels associated therewith and in which, for reading in information at an address of the external memory, said external memory has a second number of data channels associated therewith that is greater than said first number, the data channels of the external memory being adapted to be subdivided into a first group and a second group, said device comprising:
   an input adapted to be connected to the data channels of the memory element, for receiving information concerning the first memory cells and the second memory cells;
   an output adapted to be connected to the data channels of the external memory; and
   a means for associating the information concerning the first memory cells of the memory element with the first group of data channels of the external memory and for associating the information concerning the second memory cells of the memory element with the second group of data channels of the external memory;
   wherein said means for associating the information associates the addresses of the memory cells of the memory element with addresses of the external memory; and
   wherein said means for associating the information is configured to simultaneously store, in said first group of memory cells at a target address in the external memory, information concerning first memory cells of the memory element and, in said second group of memory cells at the target address in the external memory, information concerning second memory cells at an address of the memory element associated with said target address.

8. A memory component comprising a memory element having first memory cells and second memory cells and a device for associating information concerning first memory cells and second memory cells of a memory element with an external memory, each address of the memory element having a first predetermined number of memory cells associated therewith, each address of the external memory having a second predetermined number of memory cells associated therewith that is greater than said first predetermined number, said second predetermined number of memory cells on each address of the external memory being adapted to be subdivided into a first group of memory cells and a second group of memory cells, said device comprising:
   an input for receiving the information concerning said first and second memory cells;

a means for associating the information concerning first memory cells with the first group of memory cells in the external memory and for associating the information concerning the second memory cells with the second group of memory cells in the external memory; and an output adapted to be connected to the external memory for outputting the information concerning the memory cells of the memory element to the associated group in the external memory;

wherein said means for associating the information associates the addresses of the memory cells of the memory element with addresses of the external memory; and wherein said means for associating the information is configured to simultaneously store, in said first group of memory cells at a target address in the external memory, information concerning first memory cells of the memory element and, in said second group of memory cells at the target address in the external memory, information concerning second memory cells at an address of the memory element associated with said target address.

9. A memory testing device comprising a device for associating information concerning first memory cells and second memory cells of a memory element with an external memory, each address of the memory element having a first predetermined number of memory cells associated therewith, each address of the external memory having a second predetermined number of memory cells associated therewith that is greater than said first predetermined number, said second predetermined number of memory cells on each address of the external memory being adapted to be subdivided into a first group of memory cells and a second group of memory cells, said device comprising:

an input for receiving the information concerning said first and second memory cells;

a means for associating the information concerning first memory cells with the first group of memory cells in the external memory and for associating the information concerning the second memory cells with the second group of memory cells in the external memory; and an output adapted to be connected to the external memory for outputting the information concerning the memory cells of the memory element to the associated group in the external memory;

wherein said means for associating the information associates the addresses of the memory cells of the memory element with addresses of the external memory; and wherein said means for associating the information is configured to simultaneously store, in said first group of memory cells at a target address in the external memory, information concerning first memory cells of the memory element and, in said second group of memory cells at the target address in the external memory, information concerning second memory cells at an address of the memory element associated with said target address.

10. A method for associating information concerning first memory cells and second memory cells of a memory element with an external memory, each address of the memory element having a first predetermined number of memory cells associated therewith, each address of the external memory having a second predetermined number of memory cells associated therewith that is greater than said first predetermined number, said second predetermined number of memory cells on each address of the external memory being adapted to be subdivided into a first group of memory cells and a second group of memory cells, said method comprising the steps of:

receiving the information concerning said first and second memory cells;

assigning the information concerning the first memory cells to the first group of memory cells in the external memory;

assigning the information concerning the second memory cells to the second group of memory cells in the external memory; and outputting the information concerning the memory cells of the memory element to the associated group in the external memory;

wherein assigning the information includes assigning the addresses of the memory cells of the memory element with addresses of the external memory; and wherein assigning the information includes simultaneously storing, in said first group of memory cells at a target address in the external memory, information concerning first memory cells of the memory element and, in said second group of memory cells at the target address in the external memory, information concerning second memory cells at an address of the memory element associated with said target address.

11. The method of claim 10, wherein the information concerning the first and second memory cells of the memory element comprises information on operability of said first and second memory cells.

* * * * *